United States Patent
Janardan et al.

(10) Patent No.: US 8,411,518 B2
(45) Date of Patent: Apr. 2, 2013

(54) MEMORY DEVICE WITH BOOST COMPENSATION

(75) Inventors: Dhori Kedar Janardan, Gujrat (IN); Rakesh Kumar Sinha, Bihar (IN); Sachin Gulyani, Delhi (IN)

(73) Assignee: STMicroelectronics Pvt. Ltd., Greater Noida (IN)

( * ) Notice: Subject to any disclaimer, the term of this patent is extended or adjusted under 35 U.S.C. 154(b) by 139 days.

(21) Appl. No.: 12/981,031

(22) Filed: Dec. 29, 2010

(65) Prior Publication Data
US 2012/0170391 A1 Jul. 5, 2012

(51) Int. Cl.
*G11C 7/00* (2006.01)
(52) U.S. Cl. .......... 365/194; 365/211
(58) Field of Classification Search .......... 365/194, 365/211
See application file for complete search history.

(56) References Cited

U.S. PATENT DOCUMENTS

| | | | |
|---|---|---|---|
| 6,104,653 A | 8/2000 | Proebsting | |
| 6,934,209 B2 * | 8/2005 | Marr | 365/211 |
| 8,004,918 B2 * | 8/2011 | Gouin | 365/211 |
| 2007/0030722 A1 | 2/2007 | Chanussot et al. | |
| 2007/0030741 A1 | 2/2007 | Nii et al. | |
| 2007/0081379 A1 | 4/2007 | Clinton et al. | |
| 2008/0130378 A1 | 6/2008 | Nautiyal | |
| 2009/0235171 A1 | 9/2009 | Adams et al. | |
| 2010/0188909 A1 | 7/2010 | Kenkare et al. | |
| 2012/0170391 A1 | 7/2012 | Janardan et al. | |

OTHER PUBLICATIONS

Wang, et al., A 45nm Dual-Port SRAM with Write and Read Capability Enhancement at Low Voltage, IEEE, Sep. 26-29, 2007 ; pp. 211-214, ISBN: 978-1-4244-1592-2, Digital Object Identifier : 10.1109/SOCC.2007.4545460, located at http://ieeexplore.ieee.org/stamp/stamp.jsp?tp=&arnumber=4545460.

* cited by examiner

*Primary Examiner* — Son Dinh
*Assistant Examiner* — Nam Nguyen
(74) *Attorney, Agent, or Firm* — Gardere Wynne Sewell LLP

(57) ABSTRACT

A memory circuit includes a memory cell configured to be re-writable. A write enable circuit is configured to enable writing a signal via a pair of bit lines to the memory cell depending on a write signal. A charge supply circuit is configured to supply a charge to at least one of the pair of bit lines. A charge supply controller is configured to control the charge supply circuit to supply the charge dependent on at least one of the temperature of the memory circuit and the potential difference supply of the memory circuit.

37 Claims, 7 Drawing Sheets

MEMORY DEVICE WITH BOOST COMPENSATION

TECHNICAL FIELD

The present invention relates to memory devices, for example but not exclusively to random access memory devices in integrated circuits.

BACKGROUND

Memory devices are commonly employed as internal storage areas in computer or processors or other types of electronic equipment. One specific type of memory used to store data in a computer is random access memory (RAM) such as static RAM (SRAM) or dynamic RAM (DRAM). RAM is typically used for example as main memory in a computer. Furthermore random access memory is generally volatile in that once power has been removed the data stored in the memory is lost.

A typical SRAM device includes an array of individual SRAM cells. Each SRAM cell is capable of storing a binary voltage value therein which represents a logical data bit in other words a '0' or '1'. One known configuration for SRAM cells includes a pair of cross coupled devices such as inverters formed from pairs of complementary metal oxide semiconductor (CMOS) transistors. For example each inverter can be a PMOS FET (p-channel field effect transistor) and a complimentary NMOS FET (n-channel field effect transistor). The inverter is connected in a cross coupled configuration and forms a latch that stores the data as long as the power is maintained to the memory cell. In a conventional six transistor (6T) cell, a pair of access transistors or pass gates (actuated by a word-line WL signal) selectively couples the inverters to a pair of complimentary bit-lines (BL). In other SRAM designs any suitable number of transistors can be implemented such as for example 4T, 8T memory cells.

Designing SRAM cells traditionally involves a compromise between the read and write functions of the memory cell to maintain cell stability, the read performance and the write performance. The transistors which form the cross coupled pair should be weak enough to be overdriven during a write operation while also being strong enough to maintain a data value while driving a bit line during a read operation. The access transistors that connect the cross coupled cell nodes to the true and complement bit lines affect both the stability and performance of the cell. In one port or single port SRAM cells a single pair of access transistors is used for both read and write access to the cell. The gates are driven to a digital value in order to switch the transistors between an on and off the state. The write operation optimisation of the access transistors requires a low on-resistance however the read optimisation requires a high on-resistance to isolate the cell from the bit line capacitance and prevent a cell disturb event.

One proposed approach to improve write performance of SRAM device is to use a 'negative boost' to discharge a bit-line to a voltage level below the nominal low supply rail value (for example ground) so that the access transistors of the SRAM cell coupled to the discharge bit-line see a resultant increase in both the gate to source and the drain to source voltages.

However there are problems associated with this technique. For example at high temperatures or voltages or in areas of the integrated circuit where process parameters lead to poor insulation in the FET the application of the 'negative boost' or 'negative bump' can be detrimental to the reliability of the circuit. For example the 'negative boost' effect is generally proportional to temperature as the capacitor used to generate the negative boost is typically a MOSFET capacitor. Furthermore similarly the 'negative boost' is proportional to the supply voltage $V_{dd}$ as the charge stored by the capacitor is increased.

It has been proposed that in order to limit the effects of the 'negative boost' write assist operation that diodes can be used to clamp boost applied. However such diode clamps are not effective as they cannot compensate the peak boost voltage generated at high voltage and temperature and this poses serious restrictions on the bump value at lower voltage and temperature.

SUMMARY

It is an aim of embodiments of the present application to overcome these problems by implementing a negative boost compensator able to be temperature or voltage or process dependent.

According to a first aspect, there is provided a memory circuit comprising: a memory cell configured to be re-writable; a write enable circuit configured to enable writing a signal via a pair of bit lines to the memory cell depending on a write signal; a charge supply circuit configured to supply a charge to at least one of the pair of bit lines; and a charge supply controller configured to control the charge supply circuit to supply the charge dependent on at least one of the temperature of the memory circuit and the potential difference supply of the memory circuit.

The charge supply controller may comprise charge compensation circuit comprising a current source coupled to the charge supply circuit configured to control the supply of charge to the at least one bit line.

The current source may comprise a sub-threshold biased transistor configured to limit the supply of charge to the at least one bit line dependent on the temperature of the transistor.

The charge compensation circuit may comprise a biasing circuit configured to supply a bias potential to the sub-threshold biased transistor, wherein the biasing circuit is configured to output a bias potential dependent on the potential difference supply of the memory circuit.

The biasing circuit may comprise a write input, wherein the bias circuit is configured to operate the sub-threshold biased transistor in a sub-threshold mode when receiving a first write input signal value and operate the sub-threshold transistor in a non-conductive mode when receiving a second write input signal value.

The charge supply controller may further comprise a potential coupling transistor configured to selectively couple the sub-threshold transistor to a high potential supply rail, wherein the potential coupling transistor is configured to receive a delayed write input signal.

The charge supply controller may be configured to control the charge supply circuit to supply the charge dependent on at the potential on the at least one bit line.

The charge supply controller may comprise a potential threshold determiner configured to determine when at least one bit line potential is less than a defined potential value; and a charge supply driver configured to selectively couple the charge supply circuit to at least one of the pair of bit lines dependent on the potential threshold determiner.

The charge supply controller may comprise a threshold value determiner configured to determine the defined potential value dependent on at least one of the temperature of the memory circuit and the potential difference supply of the memory circuit.

The charge supply controller may be configured to control the timing of the charge supply circuit to supply the charge dependent at least one of the temperature of the memory circuit and the potential difference supply of the memory circuit.

The charge supply controller may comprise: a configurable delay circuit configured to receive the write signal and output a delayed write signal; and a charge supply driver configured to selectively couple the charge supply circuit to at least one of the pair of bit lines dependent on the delayed write signal.

The configurable delay circuit may be configured to delay the write signal by a period dependent on at least one of the temperature of the memory circuit and the potential difference supply of the memory circuit.

An integrated circuit memory device may comprise the circuit as described herein.

A processor may comprise the circuit as described herein.

According to a second aspect, there is provided a method of operating a memory circuit comprising: controlling a charge boost supplied to at least one of the pair of bit lines coupled to a memory cell dependent on at least one of the temperature of the memory circuit and the potential difference supply of the memory circuit.

Controlling a charge boost supplied to at least one of the pair of bit lines may comprise coupling a current source to a charge supply circuit for supplying the charge boost.

Coupling the current source may comprise coupling a sub-threshold biased transistor for limiting the supply of charge to the at least one bit line substantially dependent on the temperature of the transistor.

Coupling the current source may further comprise coupling a biasing circuit to the sub-threshold transistor, and supplying a bias potential to the sub-threshold biased transistor, wherein the bias potential is substantially dependent on the potential difference supply of the memory circuit.

Supplying a bias potential to the sub-threshold biased transistor may further comprise supplying a bias potential dependent on a write input signal value, wherein supplying a bias potential dependent on a write input signal value may comprise supplying a sub-threshold bias when receiving a first write input signal value and supplying an off bias when receiving a second write input signal value.

Coupling the current source may comprise coupling via a potential coupling transistor the sub-threshold transistor to a high potential supply rail, dependent on a delayed write input signal value.

Controlling a charge boost may comprise controlling the coupling of the charge boost dependent on at the potential on the at least one bit line.

Controlling the coupling of the charge boost may comprise selectively coupling the charge supply circuit to at least one of the pair of bit lines when the at least one bit line potential is less than a defined potential value.

Controlling the coupling of the charge boost may further comprise defining the defined potential value dependent on at least one of the temperature of the memory circuit and the potential difference supply of the memory circuit.

Controlling a charge boost may comprise controlling the timing of the supply of the charge boost dependent at least one of the temperature of the memory circuit and the potential difference supply of the memory circuit.

Controlling the timing of the supply of the charge boost may comprise: delaying a write signal to output a delayed write signal; and selectively coupling the charge boost to at least one of the pair of bit lines dependent on the delayed write signal.

Delaying a write signal to output a delayed write signal may comprise delaying the write signal by a period dependent on at least one of the temperature of the memory circuit and the potential difference supply of the memory circuit.

According to a third aspect there is provided a computer-readable medium encoded with instructions that, when executed by a computer, perform a method of operating a memory circuit comprising: controlling a charge boost supplied to at least one of the pair of bit lines coupled to a memory cell dependent on at least one of the temperature of the memory circuit and the potential difference supply of the memory circuit.

Controlling a charge boost supplied to at least one of the pair of bit lines may cause the computer to perform coupling a current source to a charge supply circuit for supplying the charge boost.

Coupling the current source may cause the computer to perform coupling a sub-threshold biased transistor for limiting the supply of charge to the at least one bit line substantially dependent on the temperature of the transistor.

Coupling the current source may cause the computer to perform coupling a biasing circuit to the sub-threshold transistor, and supplying a bias potential to the sub-threshold biased transistor, wherein the bias potential is substantially dependent on the potential difference supply of the memory circuit.

Supplying a bias potential to the sub-threshold biased transistor may cause the computer to perform supplying a bias potential dependent on a write input signal value, wherein supplying a bias potential dependent on a write input signal value may cause the computer to perform supplying a sub-threshold bias when receiving a first write input signal value and supplying an off bias when receiving a second write input signal value.

Coupling the current source may cause the computer to perform coupling via a potential coupling transistor the sub-threshold transistor to a high potential supply rail, dependent on a delayed write input signal value.

Controlling a charge boost may cause the computer to perform controlling the coupling of the charge boost dependent on at the potential on the at least one bit line.

Controlling the coupling of the charge boost may cause the computer to perform selectively coupling the charge supply circuit to at least one of the pair of bit lines when the at least one bit line potential is less than a defined potential value.

Controlling the coupling of the charge boost may cause the computer to perform defining the defined potential value dependent on at least one of the temperature of the memory circuit and the potential difference supply of the memory circuit.

Controlling a charge boost may cause the computer to perform controlling the timing of the supply of the charge boost dependent at least one of the temperature of the memory circuit and the potential difference supply of the memory circuit.

Controlling the timing of the supply of the charge boost may cause the computer to perform: delaying a write signal to output a delayed write signal; and selectively coupling the charge boost to at least one of the pair of bit lines dependent on the delayed write signal.

Delaying a write signal to output a delayed write signal may cause the computer to perform delaying the write signal by a period dependent on at least one of the temperature of the memory circuit and the potential difference supply of the memory circuit.

According to a fourth aspect there is provided an apparatus comprising at least one processor and at least one memory including computer program code the at least one memory and the computer program code configured to, with the at least one processor, cause the apparatus at least to perform: controlling a charge boost supplied to at least one of the pair of bit lines coupled to a memory cell dependent on at least one of the temperature of the memory circuit and the potential difference supply of the memory circuit.

Controlling a charge boost supplied to at least one of the pair of bit lines may cause the apparatus to perform coupling a current source to a charge supply circuit for supplying the charge boost.

Coupling the current source may cause the apparatus to perform coupling a sub-threshold biased transistor for limiting the supply of charge to the at least one bit line substantially dependent on the temperature of the transistor.

Coupling the current source may cause the apparatus to perform coupling a biasing circuit to the sub-threshold transistor, and supplying a bias potential to the sub-threshold biased transistor, wherein the bias potential is substantially dependent on the potential difference supply of the memory circuit.

Supplying a bias potential to the sub-threshold biased transistor may cause the apparatus to perform supplying a bias potential dependent on a write input signal value, wherein supplying a bias potential dependent on a write input signal value may cause the apparatus to perform supplying a sub-threshold bias when receiving a first write input signal value and supplying an off bias when receiving a second write input signal value.

Coupling the current source may cause the apparatus to perform coupling via a potential coupling transistor the sub-threshold transistor to a high potential supply rail, dependent on a delayed write input signal value.

Controlling a charge boost may cause the apparatus to perform controlling the coupling of the charge boost dependent on at the potential on the at least one bit line.

Controlling the coupling of the charge boost may cause the apparatus to perform selectively coupling the charge supply circuit to at least one of the pair of bit lines when the at least one bit line potential is less than a defined potential value.

Controlling the coupling of the charge boost may cause the apparatus to perform defining the defined potential value dependent on at least one of the temperature of the memory circuit and the potential difference supply of the memory circuit.

Controlling a charge boost may cause the apparatus to perform controlling the timing of the supply of the charge boost dependent at least one of the temperature of the memory circuit and the potential difference supply of the memory circuit.

Controlling the timing of the supply of the charge boost may cause the apparatus to perform: delaying a write signal to output a delayed write signal; and selectively coupling the charge boost to at least one of the pair of bit lines dependent on the delayed write signal.

Delaying a write signal to output a delayed write signal may cause the apparatus to perform delaying the write signal by a period dependent on at least one of the temperature of the memory circuit and the potential difference supply of the memory circuit.

According to a fifth aspect there is provided apparatus comprising: means for controlling a charge boost supplied to at least one of the pair of bit lines coupled to a memory cell dependent on at least one of the temperature of the memory circuit and the potential difference supply of the memory circuit.

The means for controlling a charge boost supplied to at least one of the pair of bit lines may comprise means for coupling a current source to a charge supply circuit for supplying the charge boost.

The means for coupling the current source may comprise means for coupling a sub-threshold biased transistor for limiting the supply of charge to the at least one bit line substantially dependent on the temperature of the transistor.

The means for coupling the current source may further comprise means for coupling a biasing circuit to the sub-threshold transistor, and means for supplying a bias potential to the sub-threshold biased transistor, wherein the bias potential is substantially dependent on the potential difference supply of the memory circuit.

The means for supplying a bias potential to the sub-threshold biased transistor may further comprise means for supplying a bias potential dependent on a write input signal value, wherein means for supplying a bias potential dependent on a write input signal value may comprise means for supplying a sub-threshold bias when receiving a first write input signal value and means for supplying an off bias when receiving a second write input signal value.

The means for coupling the current source may comprise means for coupling via a potential coupling transistor the sub-threshold transistor to a high potential supply rail, dependent on a delayed write input signal value.

The means for controlling a charge boost may comprise means for controlling the coupling of the charge boost dependent on at the potential on the at least one bit line.

The means for controlling the coupling of the charge boost may comprise means for selectively coupling the charge supply circuit to at least one of the pair of bit lines when the at least one bit line potential is less than a defined potential value.

The means for controlling the coupling of the charge boost may further comprise means for defining the defined potential value dependent on at least one of the temperature of the memory circuit and the potential difference supply of the memory circuit.

The means for controlling a charge boost may comprise means for controlling the timing of the supply of the charge boost dependent at least one of the temperature of the memory circuit and the potential difference supply of the memory circuit.

The means for controlling the timing of the supply of the charge boost may comprise: means for delaying a write signal to output a delayed write signal; and means for selectively coupling the charge boost to at least one of the pair of bit lines dependent on the delayed write signal.

The means for delaying a write signal to output a delayed write signal may comprise means for delaying the write signal by a period dependent on at least one of the temperature of the memory circuit and the potential difference supply of the memory circuit.

BRIEF DESCRIPTION OF THE DRAWINGS

Reference will be made by way of example only to the accompanying drawings in which.

DETAILED DESCRIPTION OF THE DRAWINGS

This document describes apparatus and methods for operating a memory cell write using boost assist or 'negative boost'. The embodiments of the application aim to produce an improvement over the present approaches by applying compensation to the boost dependent on the external parameters such as operating voltage ($V_{dd}$) and temperature.

Figure 1A:
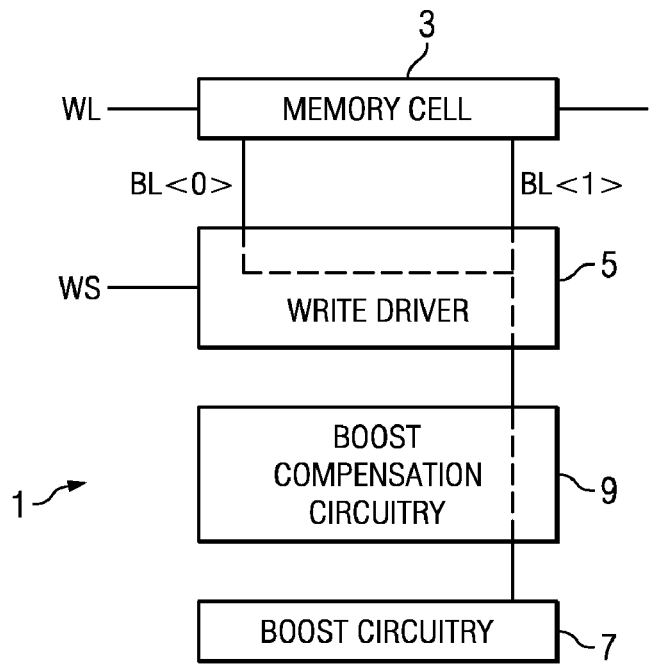
FIG. 1a shows schematically a memory device according to some embodiments of the application.

With respect to FIG. 1a an example of the memory device suitable for employment in embodiments of the application is shown. Furthermore with respect to FIG. 1b a detailed component level schematic view of the apparatus shown in FIG. 1a according to some embodiments of the application is shown. With respect to the following examples shown a memory device is shown with a single memory cell with a single port, however it would be understood that the memory device can comprise many memory cells arranged in any suitable memory cell configuration and the example shown is for simplifying the explanation of the application. Furthermore the typical operations of memory devices are not described in detail excepting where embodiments of the application relate to them. Thus for example the operation of reading from the memory cell, addressing the memory cell, and writing to the memory other then in embodiments of the application are not described in further detail and can be implemented in any suitable manner.

Figure 1B:
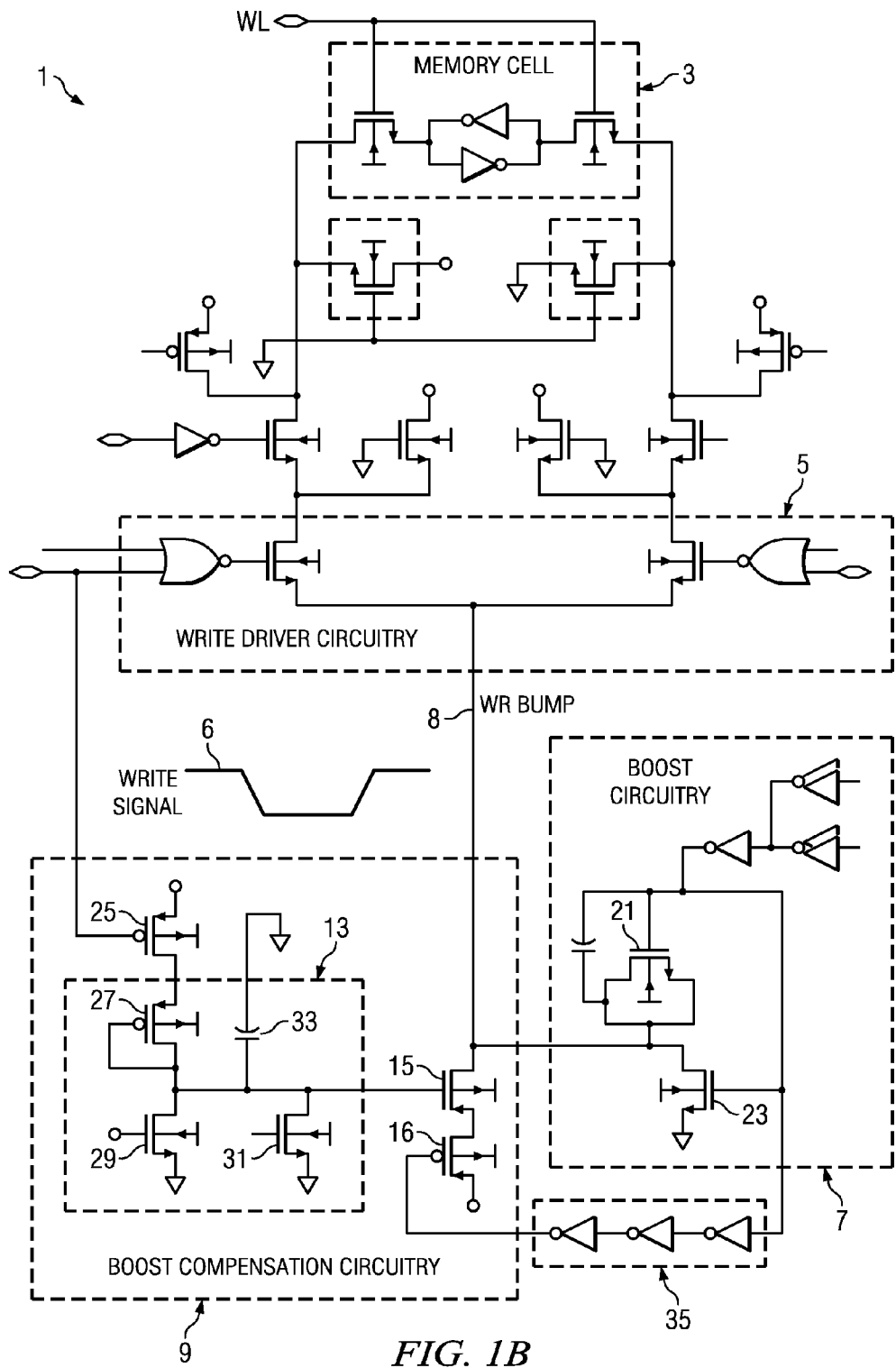
FIG. 1b shows schematically the memory device of FIG. 1a in Further detail.

The memory device 1 as shown in FIG. 1a can comprise a memory cell 3. The memory cell 3 is in some embodiments configured to store a logical bit value and has an associated word line (WL) which when enabled connects or couples the bit lines (true and complimentary (BL<0>, BL<1>) to the memory cell 3. The memory cell can be any suitable memory cell such as a six transistor (6T) SRAM memory cell. However it would be understood that the memory cell can be any suitable memory cell configuration. The memory cell 3 shown for example in FIG. 1b is a conventional six transistor memory cell comprising a pair of cross coupled inverters, each comprising a pair of transistors, and a pair of pass transistors coupling the memory cell inverter outputs to the pair of bit lines (BL<0>, BL<1>).

The memory device 1 furthermore in some embodiments comprises write driver circuitry 5 configured to couple one or other of the bit lines to further circuitry and/or a low voltage supply rail. In some embodiments such as shown in FIG. 1b the write driver circuitry is shown coupling one or other of the bit-lines to 'ground' and to a boost compensation circuitry 9 and boost circuitry 7. Furthermore in the example shown in FIG. 1b the write driver circuitry 6 comprises a pair of NOR gates receiving a data or complimentary data input (write signal) 6 and a write clock signal, the output of each NOR gate being coupled to a gate terminal of a pass transistor coupling the true or complimentary bit-line to the further circuitry and/or a low voltage supply rail. However the implementation of the write driver circuitry 5 can be implemented by any suitable means.

The memory device 1 furthermore in some embodiments comprises boost circuitry 7 configured to supply a 'negative boost' or negative potential bump to the coupled bit line when enabled. In some embodiments such as shown in FIGS. 1a and 1b the boost circuitry can be configured to be coupled to the bit lines via the write driver circuitry 5 which is configured to couple the selected bit line and via the boost compensation circuitry 9. However the boost circuitry 7 can be coupled to the selected bit line in any suitable configuration and the boost compensation circuitry 9 independently coupled to the boost circuitry 7. The boost circuitry 7, as shown in FIG. 1b, can comprise in some embodiments a CMOS transistor 21 configured in a capacitor arrangement 21 and configured to operate such that when the boost circuitry is disabled the capacitor has a first terminal coupled to a positive voltage and the other terminal coupled to the low supply voltage rail and when the boost circuitry is enabled the capacitor has the first terminal coupled to the low voltage rail and the other terminal coupled to the write driver circuitry 5 causing the other terminal to supply a negative potential boost or bump to the write driver circuitry 5 coupled bit line. However in other embodiments any suitable negative boost circuitry configuration can be implemented using any suitable capacitor or charge generator.

The memory device furthermore comprises boost compensation circuitry 9 which in some embodiments is configured to operate between the boost circuitry 7 and the write driver circuitry 5 and configured to provide a compensation effect to the boost circuitry 7 such that the boost circuitry at high temperatures or high supply voltages is not able to cause damage to the memory cell or other transistor components of the memory device. Although the boost compensation circuitry 9 is shown in FIGS. 1a, 1b, and 2a to 2d are shown coupled between the boost circuitry 7 and the write driver circuitry 5 it would be understood that the boost compensation circuitry 9 can be configured to operate in any suitable configuration in such a way that the boost compensation circuitry 9 has an effect on the boost circuitry 7. For example in some embodiments the boost compensation circuitry can operate directly on the boost circuitry 7 where the boost circuitry 7 is directly coupled to the bit lines or write driver circuitry 5.

Figure 2A:
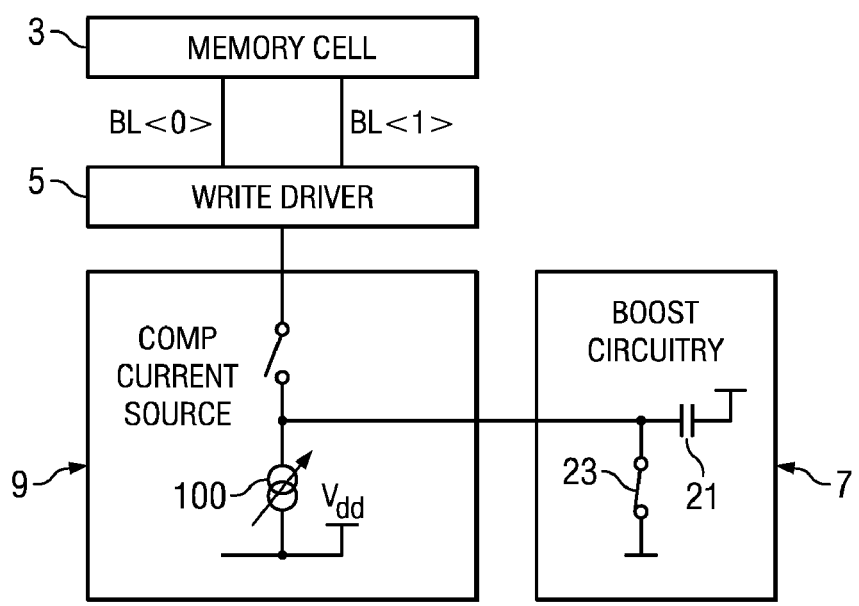
FIGS. 2a to 2d show schematically the boost compensation circuitry in further detail according to some embodiments.

With respect to FIG. 2a a schematic representation of the boost compensation circuitry 9 according to some embodiments is shown. In such embodiments the boost compensation circuitry 9 can comprise a compensation current source 100 coupled between the boost circuitry 7 and a potential supply rail. The compensation current source 100 can therefore in some embodiments be configured to operate in such a way that when the supply potential rises or when the temperature increases the compensation current source supplies charge to the other terminal of the capacitor 21 of the boost circuitry 7 thus decreasing the potential difference across the capacitor plates and therefore reducing the negative boost applied.

With respect to FIG. 1b the compensation current source 100 arrangement comprising part of the boost compensation circuitry 9 is shown in further detail. The boost compensation circuitry 9 in such embodiments comprises a sub-threshold transistor 15 configured to be operated in a sub-threshold region and coupling the boost circuitry 7 to a supply rail. In some embodiments the sub-threshold transistor 15 is configured to couple the boost circuitry 7 to a supply rail ($V_{dd}$) via a transistor switch 16 configured to be activated when the boost circuitry 7 is not active and deactivated, after a short period of time producing a pulse, when the boost circuitry 7 is activated to supply the negative boost. It would be understood that whilst in sub-threshold mode the transistor can operate as a current source which generates a current which is exponential function of the gate source voltage. Furthermore it would be known that as the threshold voltage depends on the temperature that a change in the temperature of the device will have an effect on the current generated by the source whilst in the sub-threshold range.

The sub-threshold transistor 15 is controlled by a biasing circuit 13 and a boost compensation write signal switch transistor 25. The boost compensation write signal switch transistor 25 is configured to activate the biasing circuit 13 when the write enable signal is enabled (which in some embodiments is when the signal is brought to a low state) by a pmos transistor having a source coupled to the positive supply rail, the gate coupled to the write signal line and the drain coupled to the biasing circuit 13. The biasing circuit 13 further comprises in some embodiments a drain-gate connected transistor 27 coupling the boost compensation write signal switch transistor 25 to the gate of the sub-threshold transistor. This can be implemented as shown in FIG. 1b by a pmos transistor with gate and drain coupled together and further coupled to the gate of the sub-threshold transistor and a source coupled to the boost compensation write signal switch transistor 25 drain. The biasing circuit 13 further comprises a first low biasing transistor 29. The first low biasing transistor 29 can be configured as shown in FIG. 1b to be a nmos transistor with gate coupled to the supply voltage, source coupled to low supply voltage (i.e. ground), and the drain coupled to the gate of the sub-threshold transistor 15. Furthermore in some embodiments the biasing circuit 13 comprises a second low biasing transistor 31. In some embodiments the biasing circuit further comprises a configuration transistor 16 configured to couple the sub-threshold transistor 15 to the high supply voltage (Vdd). The configuration transistor 16 can be configured to receive a gate input via an inverter chain 35 coupled between the boost circuitry 7 and the biasing circuit.

The second low biasing transistor 31 is configured to switch off the sub-threshold transistor 15 while operating in the inactive mode so there is no dc current flow from the transistor 16 to the transistor 23 because the first low biasing transistor 29 is configured to operate as a resistance and provide weak ground to the gate of the sub-threshold transistor 15. The second low biasing transistor 31 can be configured as shown in FIG. 1b to be a nmos transistor with gate coupled to a write signal 6, source coupled to low supply voltage (i.e. ground), and the drain coupled to the gate of the sub-threshold transistor 15. Furthermore in some embodiments the biasing circuit 13 comprises a capacitor 33 coupled between the low supply voltage (i.e. ground) and the gate of the sub-threshold transistor 15. It would thus be understood that the compensation effect in these embodiments is the composite effect of the sub-threshold transistor 15 and biasing circuit 13 with the sub-threshold transistor 15 configured to provide the major part of the temperature compensation, as biasing does not change much with respect to the temperature and the biasing circuit 13 providing the major part of the voltage compensation.

Figure 4:
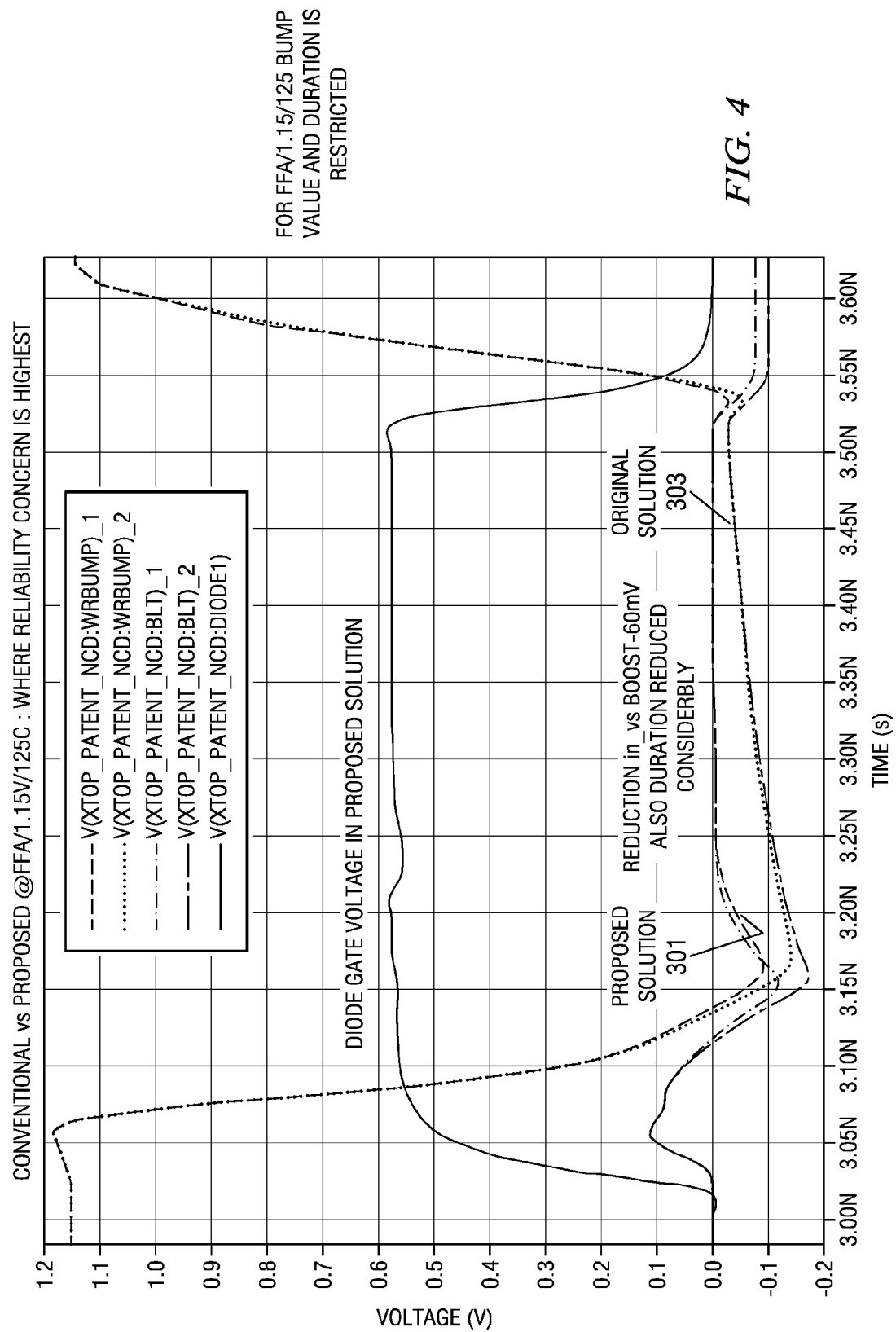
FIGS. 4 and 5 show timing diagrams of 'negative boost' signals showing voltage/temperature compensation related to 'negative boost' application.
Figure 5:
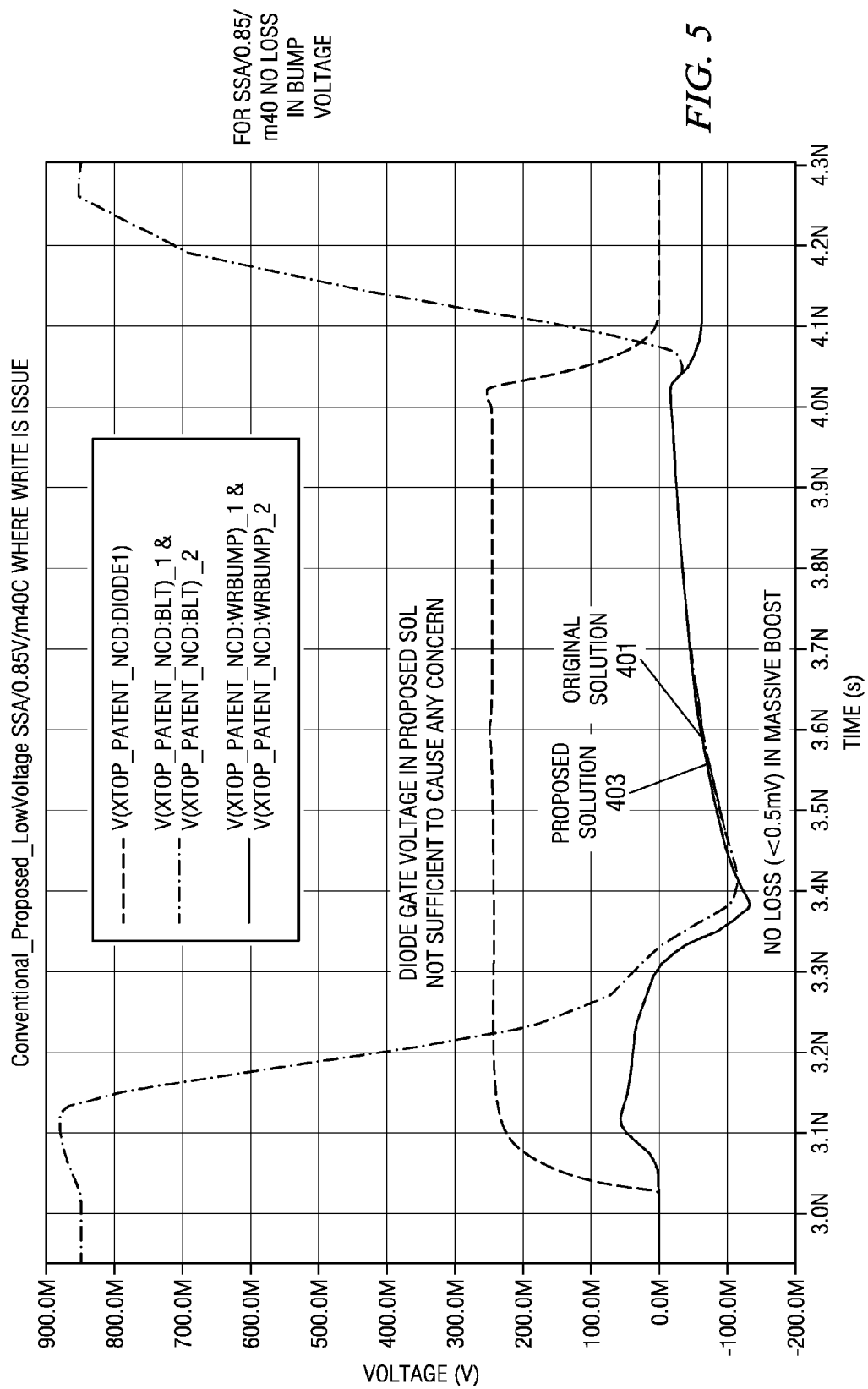

With respect to FIGS. 4 and 5 examples of the simulated results produced by embodiments of the application compared to conventional negative boosting is shown. With respect to FIG. 4 a high temperature or high voltage situation is shown whereby a conventional boosting causes the potential of the bit line 303 to drop significantly below 0.1 V which in some embodiments may cause issues with oxide breakdown for device transistors. Whereas as also shown in FIG. 4 the high temperature and voltage situation in the embodiments of the application simulation show that due to the reduction in the negative boost effect by the sub-threshold transistor supplying sufficient current to reduce the capacitor potential difference the bit line potential 301 when the negative boost is applied drops to 0.1 V. As the boost value and associated duration is restricted the reliability of the transistors of the memory cell can be improved.

With respect to FIG. 5 example are shown with low temperature and low supply voltages are used and in which there is no loss in boost or bump effect or voltage between the previous boost bit line potential 401 and for the embodiments of the application bit line potential 403 and thus the performance is not degraded at low temperatures and/or low supply voltages where the probability of negative boost related damage to the memory is small.

Figure 6A:
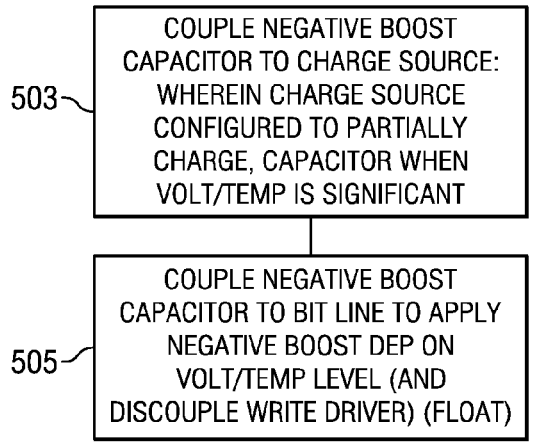
FIGS. 6a to 6c show flow diagrams of the operation of boost compensation circuitry according to some embodiments of the application.

The operation of these embodiments can be shown with respect to FIG. 6a. In such embodiments when the write signal is activated the biasing circuit 13 is configured to couple the current or charge source to the capacitor such that when the temperature and/or supply voltage is significant the current source supplies current to the lower voltage terminal of the capacitor 21 whilst pumping the charge from the capacitor 21 to the bitline in order to limit the boost voltage (to drain out excess charge while pumping), whereas when the temperature and/or supply voltage are not significant the current source is effectively inactive and the full potential difference between the capacitor terminals is generated and the full negative boost can be applied.

In other words in these embodiments the compensation circuit does not limit the charge stored in the capacitor in the steady state as the sub-threshold transistor 15 is switched off in the steady state. However the sub-threshold transistor 15 is activated when the write signal 6 is signalled and the negative bump is produced by the capacitor 21. The compensation in these embodiments is caused by draining out the excess charge while pumping not by limiting the charge stored in the capacitor and the amount of excess charge drain is controlled by the sub-threshold transistor 15, the biasing circuit 13 and the delay formed by three inverters forming the inverter chain 35 connected to gate of transistor 16.

Figure 6B:
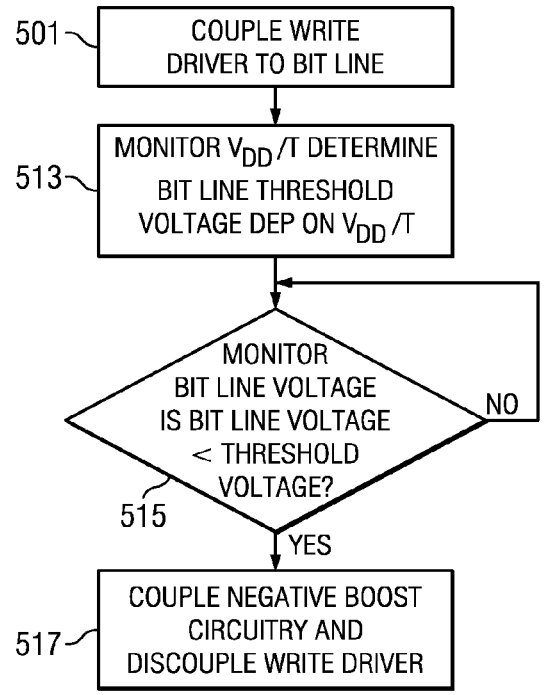

The operation of coupling the negative boost capacitor to the charge source wherein the charge source is dependent on the clock signal to drain excess charge from the capacitor, is shown in FIG. 6b in step 503.

The boost circuitry 7 can then apply the negative boost or bump to the bit line coupled to the boost circuitry 7. In the embodiments shown in FIGS. 1a, 1b and 2a this requires the write driver being maintained on coupling one of the bit lines to the boost circuitry 7, however in some embodiments where the boost circuitry 7 is coupled directly and independently to the bit line the boost circuitry 7 can be coupled to the bit line and the write circuitry decoupled (left to float).

The operation of coupling the negative boost capacitor to the bit line to apply a negative boost depending on the voltage and/or temperature is shown in FIG. 6a by step 505.

Figure 2B:
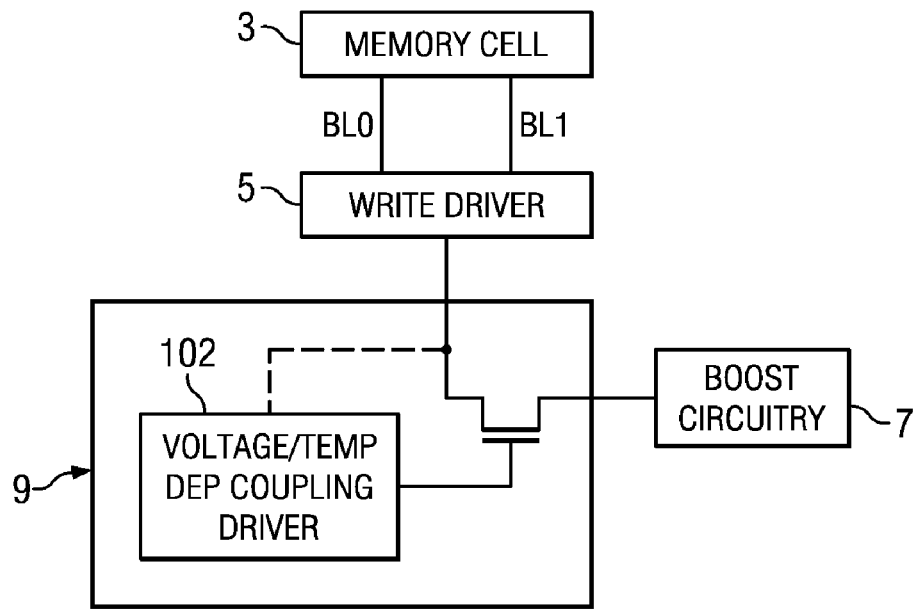

With respect to FIG. 2b and FIG. 6b, the boost compensation circuitry according to some further embodiments is shown. In these embodiments the boost compensation circuitry 9 can comprise a selective coupling between at least one of the bit lines (via the write driver circuitry 5) and the boost circuitry 7. The selective coupling for example is a switch which is configured to couple the boost circuitry 7 to the bit line on determining the bit line reaching a determined voltage or potential, wherein the determined voltage or potential is dependent on the supply voltage and the temperature. Thus in some embodiments the switch determined trigger voltage is dependent on the supply voltage in other words the larger the supply voltage $V_{dd}$ the larger the trigger voltage. Furthermore in some of these embodiments the switch can be configured such that the greater the temperature the larger the trigger voltage required to trigger the negative boost circuitry coupling. Therefore in such embodiments as the temperature/supply voltage increases and effectively increases the effect or ratio of the negative boost potential the negative boost is triggered at a sufficiently high (but decreasing due to the write driver circuitry coupling the bit line to the low supply rail) bit line potential that the negative boost effect does not generate an effect which significantly increases failure of the memory but still permits at lower temperatures and supply voltages a negative boost which allows efficient writing to the memory.

With respect to FIG. 6b the operation of such embodiments as shown in FIG. 2b are shown.

The write driver circuitry is configured to couple the bit line to a current drain in order to start the write process.

The coupling of the write driver circuitry is shown in FIG. 6b in step 501.

The voltage/temperature dependent switch or coupling driver 102 is furthermore configured in such embodiments to monitor the supply voltage and/or temperature and from these values to determine a bit line potential threshold. In other embodiments determine a potential at which the negative boost circuitry is to be triggered/coupled to the bit line. In some embodiments this monitoring operation is continuous, in some other embodiments the monitoring operation is carried out periodically.

The operation of determining a bit line threshold voltage dependent on the supply voltage and/or temperature is shown in FIG. 6b by step 513.

Furthermore the voltage/temperature dependent switch or coupling driver 102 is configured to monitor the bit line voltage against a bit line voltage threshold.

The operation of monitoring the bit line voltage against a bit line voltage threshold is shown in FIG. 6b by step 515.

While the bit line voltage is greater than (or in some embodiments equal to) the bit line voltage threshold value the monitoring is continued as shown in FIG. 6b by the 'no' output loop.

In some embodiments when the bit line voltage is less than (or in some embodiments equal to or less than) the bit line voltage threshold value the switch or coupling driver 102 can be configured to couple the boost circuitry 7 to the bit line to apply the negative boost at a potential which allows efficient writing to the memory but without causing failures.

The operation of coupling the boost circuitry 7 to the bit line is shown in FIG. 6b by step 517.

Figure 2C:
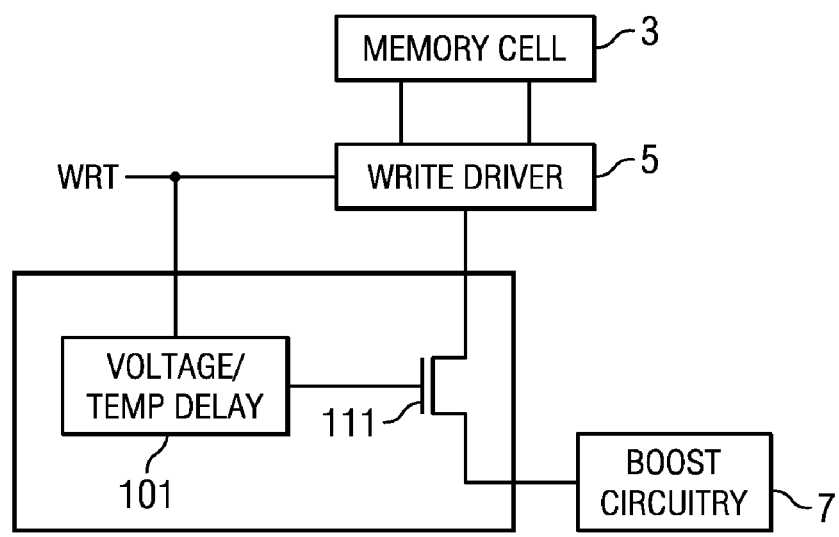
Figure 2D:
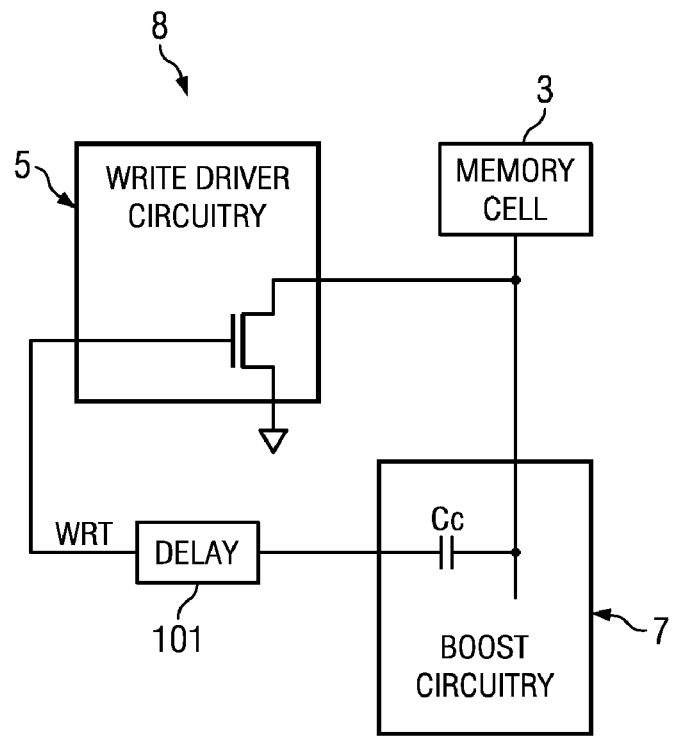
Figure 6C:
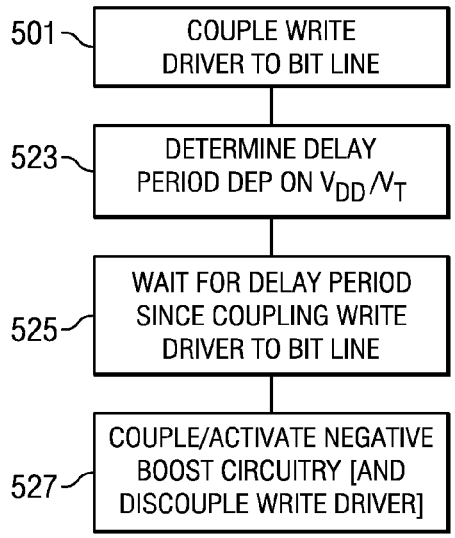

With respect to FIGS. 2c, 2d and 6c further boost compensation circuitry according to some embodiments is shown. In these embodiments the boost compensation circuitry 9 can comprise a voltage/temperature dependent delay 101 implemented between the write enable signal and a coupling or switch 111 configured to couple at least one of the bit lines (via the write driver circuitry 5) and the boost circuitry 7. The voltage/temperature dependent delay 101 and switch 111 is configured to couple the boost circuitry 7 to the bit line at a determined period after the bit line is coupled to a current drain, wherein the delay period is dependent on the supply voltage and the temperature. Thus in some embodiments the delay period is inversely dependent on the supply voltage in other words the larger the supply voltage $V_{dd}$ the shorter the delay period. Furthermore in some of these embodiments the delay period can be configured such that the greater the temperature the shorter the delay period required before triggering/coupling the negative boost circuitry coupling. Therefore in such embodiments as the temperature/supply voltage increases and effectively increases the effect or ratio of the negative boost potential the negative boost is triggered while the bit line potential is at a sufficiently high (but decreasing due to the write driver circuitry coupling the bit line to the low supply rail) bit line potential that the negative boost effect does not generate an effect which significantly increases failure of the memory but still permits at lower temperatures and supply voltages a negative boost which allows efficient writing to the memory.

FIG. 2d shows a further configuration embodiment using the voltage/temperature dependent delay 101 whereby rather than coupling the boost circuitry 7 to the bit line the boost circuitry 7 is activated at a determined time period generated by the delay 101 after the coupling of the bit line to the low supply voltage (ground) to start current drain by the write driver circuitry 5.

Figure 3:
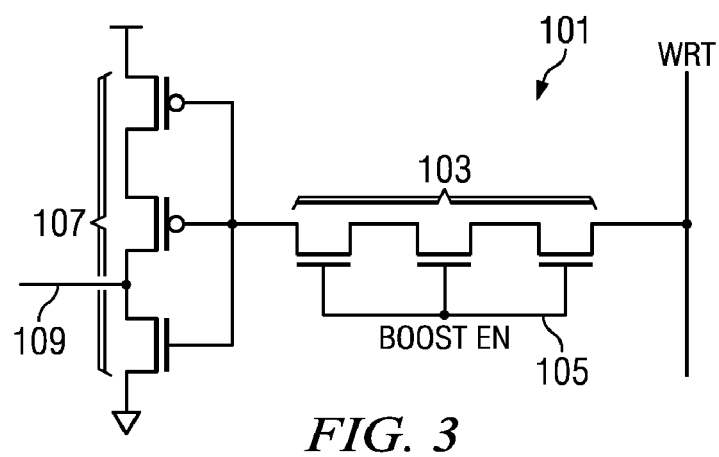
FIG. 3 shows schematically an example of circuitry for providing a voltage and temperature dependent delay period according to some embodiments of the application.

Furthermore with respect to FIG. 3 a voltage/temperature dependent delay 101 is shown in further detail with respect to embodiments such as those shown in FIG. 2. The voltage/temperature dependent delay 101, as shown in FIG. 3, can comprise a series of pass gate configured transistors 103 which are controlled from a boost enable input 105 such that when enabled the pass gate configured transistors pass the write signal to an inverter 107 comprising three transistors, a pair of serially coupled pmos transistors and a nmos transistor. The inverter 107 thus is configured to when the write signal is high to output a low signal and thus activate the boost circuitry capacitor to output the negative boost only when the write driver is disabled. The delay is generated by both the pass gate or transmission gate configuration and the inverter delay and thus can be dependent not only on the temperature but also the supply voltage such that as the temperature/voltage increases the delay decreases.

With respect to FIG. 6c the operation of such embodiments as shown in FIG. 2c and FIG. 2d are shown.

The write driver circuitry is configured to couple the bit line to a current drain in order to start the write process.

The coupling of the write driver circuitry is shown in FIG. 6c in step 501.

The voltage/temperature dependent delay 101 is furthermore configured in such embodiments to monitor the supply voltage and/or temperature and from these values to determine a delay period after which the negative boost circuitry is to be triggered/coupled to the bit line. In some embodiments this monitoring operation is continuous, in some other embodiments the monitoring operation is carried out periodically.

The operation of determining a delay period dependent on the supply voltage and/or temperature is shown in FIG. 6c by step 523.

Furthermore the voltage/temperature dependent delay 101 is configured to apply the determined delay period to the write enable signal.

The operation of delaying the write signal is shown in FIG. 6c by step 525.

After the determined delay period the voltage/temperature dependent delay 101 can be configured, in such embodiments as shown in FIG. 2c, to activate the switch 111 for coupling the boost circuitry 7 to the bit line to apply the negative boost at a potential which allows efficient writing to the memory but without causing failures. Furthermore in some embodiments, such as those similar to those shown in FIG. 2d the voltage/temperature dependent delay 101 can activate the boost circuitry 7 to apply the negative boost at a potential which allows efficient writing to the memory but without causing failures.

The operation of coupling the boost circuitry 7 to the bit line or activating the boost circuitry is shown in FIG. 6c by step 527.

In general, the various embodiments of the invention may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

The embodiments of this application can be implemented by computer software executable by a data processor, such as in the processor entity, or by hardware, or by a combination of software and hardware. Further in this regard it should be noted that any blocks of the logic flow as in the Figures may represent program steps, or interconnected logic circuits, blocks and functions, or a combination of program steps and logic circuits, blocks and functions. The software may be stored on such physical media as memory chips, or memory blocks implemented within the processor, magnetic media such as hard disk or floppy disks, and optical media such as for example DVD and the data variants thereof, CD.

The memory may be of any type suitable to the local technical environment and may be implemented using any suitable data storage technology, such as semiconductor-based memory devices, magnetic memory devices and systems, optical memory devices and systems, fixed memory and removable memory. The data processors may be of any type suitable to the local technical environment, and may include one or more of general purpose computers, special purpose computers, microprocessors, digital signal processors (DSPs), application specific integrated circuits (ASIC), gate level circuits and processors based on multi-core processor architecture, as non-limiting examples.

As used in this application, the term 'circuitry' can refer to hardware-only circuit implementations (such as implementations in only analog and/or digital circuitry) and to combinations of circuits and software (and/or firmware), such as: to a combination of processor(s) or (ii) to portions of processor (s)/software (including digital signal processor(s)), software, and memory(ies) that work together to cause an apparatus, such as a mobile phone or server, to perform various functions and to circuits, such as a microprocessor(s) or a portion of a microprocessor(s), that require software or firmware for operation, even if the software or firmware is not physically present.

This definition of 'circuitry' applies to all uses of this term in this application, including any claims. As a further example, as used in this application, the term 'circuitry' would also cover an implementation of merely a processor (or multiple processors) or portion of a processor and its (or their) accompanying software and/or firmware.

While this detailed description has set forth some embodiments of the present invention, the appended claims cover other embodiments of the present application which differ from the described embodiments according to various modifications and improvements. Other applications and configurations may be apparent to the person skilled in the art.

What is claimed is:

1. A memory circuit comprising:
    a memory cell configured to be re-writable;
    a write enable circuit configured to enable writing a signal via a pair of bit lines to the memory cell depending on a write signal;
    a negative boost circuit configured to apply a negative boost charge to at least one of the pair of bit lines; and
    a charge supply controller configured to control application of the negative boost charge by the negative boost circuit dependent on both the temperature of the memory circuit and the potential difference supply of the memory circuit.

2. The memory circuit as claimed in claim 1, wherein the charge supply controller comprises a current source coupled to said at least one of the pair of bit lines and circuit configured to control the negative boost charge.

3. The memory circuit as claimed in claim 1, wherein the charge supply controller comprises a sub-threshold biased transistor configured to limit the supply of charge by the negative boost charge as a function of temperature.

4. The memory circuit as claimed in claim 1, wherein the charge supply controller comprises:
    a transistor coupled to the at least one of the pair of bit lines; and
    a biasing circuit configured to supply a sub-threshold bias potential to said transistor, wherein the sub-threshold bias potential is dependent on the potential difference supply of the memory circuit.

5. The memory circuit as claimed in claim 4, wherein the biasing circuit comprises a write input, wherein the bias circuit is configured to operate the transistor in a sub-threshold mode when receiving a first write input signal value and operate the transistor in a non-conductive mode when receiving a second write input signal value.

6. The memory circuit as claimed in claim 3, wherein the charge supply controller further comprises a potential coupling transistor configured to selectively couple the sub-threshold transistor to a high potential supply rail, wherein the potential coupling transistor is configured to receive a delayed write input signal.

7. The memory circuit as claimed in claim 1, wherein the charge supply controller is configured to control the negative boost circuit to supply the negative boost charge dependent on the potential on the at least one bit line.

8. The memory circuit as claimed in claim 7, wherein the charge supply controller comprises a potential threshold determiner configured to determine when at least one bit line potential is less than a defined potential value; and a charge supply driver configured to selectively couple the negative boost circuit to at least one of the pair of bit lines dependent on the potential threshold determiner.

9. The memory circuit as claimed in claim 8, wherein the charge supply controller comprises a threshold value determiner configured to determine the defined potential value dependent on at least one of the temperature of the memory circuit and the potential difference supply of the memory circuit.

10. The memory circuit as claimed in claim 1, wherein the charge supply controller is configured to control the timing of the negative boost circuit to supply the negative boost charge dependent at least one of the temperature of the memory circuit and the potential difference supply of the memory circuit.

11. The memory circuit as claimed in claim 10, wherein the charge supply controller comprises: a configurable delay circuit configured to receive the write signal and output a delayed write signal; and a charge supply driver configured to selectively couple the negative boost circuit to at least one of the pair of bit lines dependent on the delayed write signal.

12. The memory circuit as claimed in claim 11, wherein the configurable delay circuit is configured to delay the write signal by a period dependent on at least one of the temperature of the memory circuit and the potential difference supply of the memory circuit.

13. A method of operating a memory circuit comprising:
controlling charge of a negative boost supplied to at least one of a pair of bit lines coupled to a memory cell of a memory circuit dependent on both the temperature of the memory circuit and the potential difference supply of the memory circuit.

14. The method as claimed in claim 13, wherein controlling the charge of the negative boost supplied to at least one of the pair of bit lines comprises controlling activation of a current source coupled to a charge supply circuit which supplies the negative boost.

15. The method as claimed in claim 14, wherein controlling activation of the current source comprises sub-threshold biasing a transistor to limit the supply of charge to the at least one bit line dependent on temperature.

16. The method as claimed in claim 14, wherein controlling activation of the current source comprises biasing a transistor to control charge on the at least one bit line dependent on the potential difference supply of the memory circuit.

17. The method as claimed in claim 16, wherein biasing further comprises supplying a bias potential to the transistor dependent on a write input signal value, wherein supplying a bias potential dependent on a write input signal value comprises supplying a sub-threshold bias when receiving a first write input signal value and supplying an off bias when receiving a second write input signal value.

18. The method as claimed in claim 15, wherein controlling activation of the current source comprises coupling the transistor to a high potential supply rail, dependent on a delayed write input signal value.

19. The method as claimed in claim 13, wherein controlling charge of the negative boost comprises controlling the application of the negative boost dependent on the potential on the at least one bit line.

20. The method as claimed in claim 19, wherein controlling application comprises selectively applying negative boost to at least one of the pair of bit lines when the at least one bit line potential is less than a threshold potential.

21. The method as claimed in claim 20, wherein the threshold potential is dependent on at least one of the temperature of the memory circuit and the potential difference supply of the memory circuit.

22. The method as claimed in claim 13, wherein controlling charge of the negative boost comprises controlling the timing of application of the negative boost dependent on at least one of the temperature of the memory circuit and the potential difference supply of the memory circuit.

23. The method as claimed in claim 22, wherein controlling the timing comprises:
delaying a write signal to output a delayed write signal; and
selectively applying the negative boost to at least one of the pair of bit lines dependent on the delayed write signal.

24. The method as claimed in claim 23, wherein delaying comprises delaying the write signal by a period dependent on at least one of the temperature of the memory circuit and the potential difference supply of the memory circuit.

25. A memory circuit, comprising:
a memory cell configured to be re-writable;
a write enable circuit configured to enable writing a signal via a pair of bit lines to the memory cell depending on a write signal;
a charge supply circuit configured to supply a charge to at least one of the pair of bit lines; and
a charge supply controller configured to control the charge supply circuit to supply the charge dependent on at least one of the temperature of the memory circuit and the potential difference supply of the memory circuit;
wherein the charge supply controller comprises a charge compensation circuit including a current source in the form of a sub-threshold biased transistor coupled to the charge supply circuit and configured to control the supply of charge to the at least one bit line dependent on the temperature of the sub-threshold biased transistor.

26. The memory circuit as claimed in claim 25, wherein the charge compensation circuit further comprises a biasing circuit configured to supply a bias potential to the sub-threshold biased transistor, wherein the biasing circuit is configured to output a bias potential dependent on the potential difference supply of the memory circuit.

27. The memory circuit as claimed in claim 26, wherein the biasing circuit comprises a write input, wherein the bias circuit is configured to operate the sub-threshold biased transistor in a sub-threshold mode when receiving a first write input signal value and operate the sub-threshold biased transistor in a non-conductive mode when receiving a second write input signal value.

28. The memory circuit as claimed in claim 25, wherein the charge supply controller further comprises a potential coupling transistor configured to selectively couple the sub-threshold transistor to a high potential supply rail, wherein the potential coupling transistor is configured to receive a delayed write input signal.

29. A memory circuit, comprising:
a memory cell configured to be re-writable;
a write enable circuit configured to enable writing a signal via a pair of bit lines to the memory cell depending on a write signal;
a charge supply circuit configured to supply a charge to at least one of the pair of bit lines; and
a charge supply controller configured to control the charge supply circuit to supply the charge dependent on at least one of the temperature of the memory circuit and the potential difference supply of the memory circuit;
wherein the charge supply controller is configured to control the charge supply circuit to supply the charge dependent on at the potential on the at least one bit line and comprises:
a potential threshold determiner configured to determine when at least one bit line potential is less than a defined potential value; and
a charge supply driver configured to selectively couple the charge supply circuit to at least one of the pair of bit lines dependent on the potential threshold determiner.

30. The memory circuit as claimed in claim 29, wherein the charge supply controller comprises a threshold value determiner configured to determine the defined potential value dependent on at least one of the temperature of the memory circuit and the potential difference supply of the memory circuit.

31. A memory circuit, comprising:
a memory cell configured to be re-writable;
a write enable circuit configured to enable writing a signal via a pair of bit lines to the memory cell depending on a write signal;
a charge supply circuit configured to supply a charge to at least one of the pair of bit lines; and
a charge supply controller configured to control the charge supply circuit to supply the charge dependent on at least one of the temperature of the memory circuit and the potential difference supply of the memory circuit;

wherein the charge supply controller is configured to control the timing of the charge supply circuit to supply the charge dependent at least one of the temperature of the memory circuit and the potential difference supply of the memory circuit.

32. The memory circuit as claimed in claim 31, wherein the charge supply controller comprises:

a configurable delay circuit configured to receive the write signal and output a delayed write signal; and a charge supply driver configured to selectively couple the charge supply circuit to at least one of the pair of bit lines dependent on the delayed write signal.

33. The memory circuit as claimed in claim 32, wherein the configurable delay circuit is configured to delay the write signal by a period dependent on at least one of the temperature of the memory circuit and the potential difference supply of the memory circuit.

34. A method of operating a memory circuit, comprising:

controlling a charge boost supplied to at least one of the pair of bit lines coupled to a memory cell dependent on at least one of the temperature of the memory circuit and the potential difference supply of the memory circuit;

wherein controlling a charge boost supplied to at least one of the pair of bit lines comprises coupling a current source to a charge supply circuit for supplying the charge boost; and wherein coupling the current source comprises coupling a sub-threshold biased transistor for limiting the supply of charge to the at least one bit line substantially dependent on the temperature of the transistor.

35. The method as claimed in claim 34, wherein coupling the current source further comprises coupling a biasing circuit to the sub-threshold transistor, and supplying a bias potential to the sub-threshold biased transistor, wherein the bias potential is substantially dependent on the potential difference supply of the memory circuit.

36. The method as claimed in claim 35, wherein supplying a bias potential to the sub-threshold biased transistor further comprises supplying a bias potential dependent on a write input signal value, wherein supplying a bias potential dependent on a write input signal value comprises supplying a sub-threshold bias when receiving a first write input signal value and supplying an off bias when receiving a second write input signal value.

37. The method as claimed in claim 34, wherein coupling the current source comprises coupling via a potential coupling transistor the sub-threshold transistor to a high potential supply rail, dependent on a delayed write input signal value.

* * * * *

UNITED STATES PATENT AND TRADEMARK OFFICE
CERTIFICATE OF CORRECTION

| | |
|---|---|
| PATENT NO. | : 8,411,518 B2 |
| APPLICATION NO. | : 12/981031 |
| DATED | : April 2, 2013 |
| INVENTOR(S) | : Dhori Kedar Janardan et al. |

It is certified that error appears in the above-identified patent and that said Letters Patent is hereby corrected as shown below:

In the Claims:

At column 14, claim number 2, line number 10, please delete the word "circuit".

Signed and Sealed this
Fourteenth Day of May, 2013

Teresa Stanek Rea
*Acting Director of the United States Patent and Trademark Office*